(12) United States Patent
Dornseifer et al.

(10) Patent No.: US 9,606,563 B2
(45) Date of Patent: Mar. 28, 2017

(54) BANDGAP REFERENCE VOLTAGE FAILURE DETECTION

(71) Applicant: Texas Instruments Deutschland GmbH, Freising (DE)

(72) Inventors: Frank Dornseifer, Freising (DE); Matthias Arnold, Freising (DE); Johannes Gerber, Unterschleissheim (DE)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 374 days.

(21) Appl. No.: 14/247,918

(22) Filed: Apr. 8, 2014

(65) Prior Publication Data
US 2015/0286236 A1    Oct. 8, 2015

(51) Int. Cl.
*G01R 31/40* (2014.01)
*G05F 3/08* (2006.01)
*G05F 3/30* (2006.01)

(52) U.S. Cl.
CPC . *G05F 3/08* (2013.01); *G05F 3/30* (2013.01)

(58) Field of Classification Search
CPC .. G01R 31/40; G01R 31/31721; G01R 31/42; G01R 31/343; G01R 31/34; G01R 31/346; G01R 31/45; G01R 31/04
USPC .................... 324/764.01, 537, 500
See application file for complete search history.

(56) References Cited

U.S. PATENT DOCUMENTS

| | | | |
|---|---|---|---|
| 6,084,383 A * | 7/2000 | Borinsky ............... | G05F 1/465 307/87 |
| 6,330,141 B1 * | 12/2001 | Elms .................... | H02H 3/0935 361/93.2 |
| 6,437,614 B1 * | 8/2002 | Chen .................... | H03K 17/145 327/143 |
| 7,711,971 B1 * | 5/2010 | Jurgilewicz ............. | G06F 1/305 323/243 |
| 8,390,333 B2 | 3/2013 | Kuhn et al. | |
| 8,400,849 B1 | 3/2013 | Dornseifer et al. | |
| 8,531,194 B2 * | 9/2013 | Edwards ................ | G01R 31/30 324/713 |
| 9,086,434 B1 * | 7/2015 | Xiao .................. | G01R 19/0092 |
| 2002/0158673 A1 * | 10/2002 | McClure .......... | G01R 19/16547 327/78 |

(Continued)

OTHER PUBLICATIONS

"Power Management Module and Supply Voltage Supervisor", Texas Instruments, Chapter Excerpt from SLAU388B, Chapter 1, pp. 1-27, Aug. 2012, revised Feb. 2013.

*Primary Examiner* — Dominic Hawkins
(74) *Attorney, Agent, or Firm* — John R. Pessetto; Charles A. Brill; Frank D. Cimino

(57) ABSTRACT

An integrated circuit is provided with a bandgap voltage reference circuit having a bandgap reference voltage output. A bandgap failure detection circuit is coupled to the bandgap reference voltage output. The bandgap failure detection forms a model value of the reference voltage from a first time, compares a present value of the reference voltage at a second time to the model value; and asserts a bandgap fail signal to indicate when the present value is less than the model value by a threshold value. The integrated circuit is reset by the bandgap fail signal. The detection circuit may be operated from a failsafe voltage domain that also allows a critical circuit to complete a pending operation during a reset.

9 Claims, 4 Drawing Sheets

(56) References Cited

U.S. PATENT DOCUMENTS

| | | | | |
|---|---|---|---|---|
| 2005/0134334 A1* | 6/2005 | Mikyska | ............... | H03K 17/223 327/143 |
| 2008/0054996 A1* | 3/2008 | Liu | ................. | G01R 19/16552 327/539 |
| 2008/0150594 A1* | 6/2008 | Taylor | ................. | H03K 17/223 327/143 |
| 2008/0290955 A1* | 11/2008 | Fort | ...................... | H03K 3/011 331/57 |
| 2010/0259304 A1* | 10/2010 | Huang | ..................... | G06F 1/24 327/143 |
| 2011/0234268 A1* | 9/2011 | Chi | ..................... | H03K 17/223 327/143 |
| 2012/0256605 A1* | 10/2012 | Lecce | ....................... | G05F 3/30 323/265 |
| 2013/0222006 A1* | 8/2013 | Weiss | ................. | G01R 31/3016 324/762.01 |
| 2013/0314068 A1* | 11/2013 | Zhen | ........................ | G05F 3/30 323/313 |

* cited by examiner

BANDGAP REFERENCE VOLTAGE FAILURE DETECTION

FIELD OF THE INVENTION

This invention generally relates to low voltage microcontroller modules that rely on a bandgap reference voltage circuit, and in particular to detection of a failure of the bandgap reference voltage circuit.

BACKGROUND OF THE INVENTION

Electronic devices, in particular integrated electronic devices, provide complex functionality for all kinds of applications. There is a general need to ensure that the electronic device can operate properly in order to avoid malfunctions or failure. There are many different control and monitoring tasks that may be implemented for this purpose. One of the most important issues is to ensure that the power supply voltage level of a power supply for supplying the electronic device is within acceptable limits for proper operation of the electronic device. Monitoring circuits such as power on reset (POR) circuitry or other solutions may be employed. Comparators may be coupled to the power supply voltage level in order to determine whether or not the power supply voltage level remains within a target window.

The voltage difference between two p-n junctions (e.g. diodes) operated at different current densities may be used to generate a proportional to absolute temperature (PTAT) current in a resistor. A bandgap reference voltage (Vbg) is a voltage reference based on the bandgap energy property, typically using two different sized bipolar junction transistors (BJT). A high precision bandgap voltage reference is a temperature independent voltage reference circuit widely used in integrated circuits, usually with an output voltage around 1.25V.

The bandgap is the energy difference between the top of the valence band and the bottom of the conduction band in insulators and semiconductors. There is virtually no bandgap in most metals, but a very large one in an insulator or dielectric. In a semiconductor, the bandgap is small. Technically, the bandgap is the energy it takes to move electrons from the valence band to the conduction band.

A BJT is a type of transistor that relies on the contact of two types of semiconductor for its operation. BJTs may be used as amplifiers, switches, or in oscillators, for example. Charge flow in a BJT is due to bidirectional diffusion of charge carriers across a junction between two regions of different charge concentrations. The regions of a BJT are typically called emitter, collector, and base

BRIEF DESCRIPTION OF THE DRAWINGS

Particular embodiments in accordance with the invention will now be described, by way of example only, and with reference to the accompanying drawings.

Figure 1:
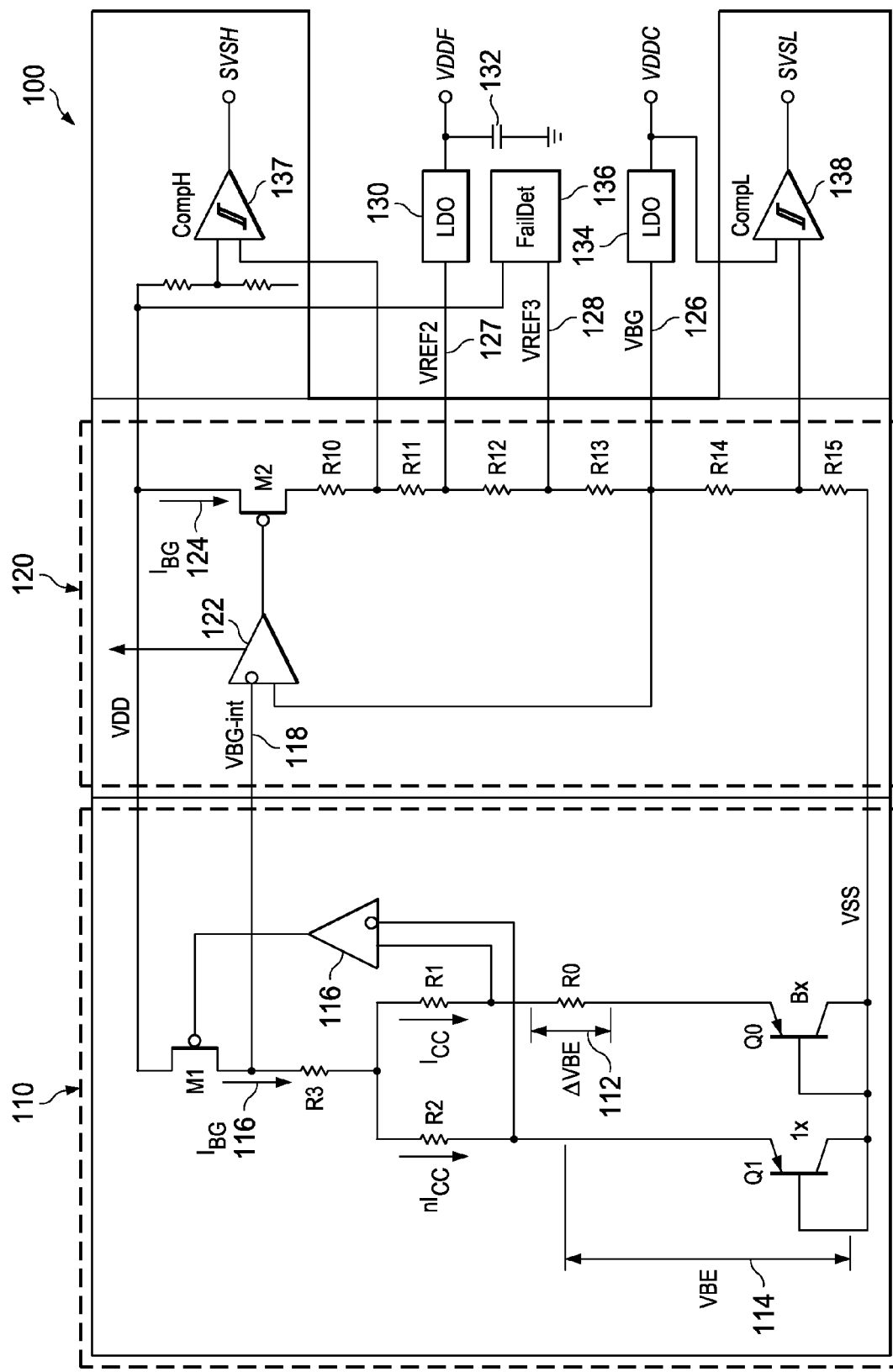
FIG. 1 is a schematic of a bandgap voltage reference circuit used in example system on chip (SoC) device.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A traditional bandgap circuit first generates a bandgap voltage and then creates a reference current using a voltage to current (V2I) converter. A traditional bandgap circuit uses either a VBG/R or ΔVBE/R method to generate a bias current (Ibias). A voltage divider network and one or more comparators may then be used to establish various voltage levels for use in a power management module (PMM) for an integrated circuit device, for example.

The PMM typically manages all functions related to providing power and its supervision for the device. Its primary functions are first to generate a supply voltage for the core logic, and second, provide several mechanisms for the supervision and monitoring of both the voltage applied to the device and the voltage generated for the core.

The PMM may use an integrated low-dropout voltage regulator (LDO) to produce a secondary core voltage (VDDC) from the primary one applied to the device (VDD). In general, VDDC supplies the CPU, memories (flash and RAM), and the digital modules, while VDD supplies the I/Os and all analog modules (including the oscillators). The VDDC output is maintained using a dedicated voltage reference. In some implementations, VDDC may be programmable in several steps, to provide only as much power as is needed for the speed that has been selected for the CPU. This enhances power efficiency of the system. The detailed operation of an example PMM is described in more detail in "Power Management Module and Supply Voltage Supervisor," SLAU388B, Texas Instruments, revised February 2013, and is incorporated by reference herein.

FIG. 1 is a schematic of and example PMM 100 that includes a bandgap voltage reference circuit 110 and an associated V2I circuit 120. In this example, LDO 130 produces a secondary voltage VDDF that is used by a non-volatile ferroelectric memory. Bandgap reference 110 uses two bipolar junction transistors (BJTs) Q0, Q1 to generate two base emitter voltages (VBE). Q1 has a smaller collector region than Q0, so the current density in Q1 is larger than in Q0 for a similar current. Therefore, a delta VBE 112 may be produced across resistor R0 that is approximately equal to VBE(Q1)−VBE(Q2). The current through resistor R0 is proportional to absolute temperature (PTAT). Op amp 116 amplifies an error signal and controls CMOS (complementary metal oxide semiconductor) transistor M1 to produce current 116 that flows through resistor R3 and is then split between resistors R1/R2. The voltage generated across resistors R2 and R3 is added to VBE voltage 114 to form the internal bandgap reference voltage VBG-int 118. The voltage across a junction operated at constant current is complementary to absolute temperature, with a change of approximately −2 mV/K. If the ratio between the resistor R0 and resistors R2, R3 is chosen properly, the first order effects of the temperature dependency of BJT Q1 and the PTAT current may approximately cancel out. The resulting voltage may be about 1.2-1.3 V, depending on the particular technology and circuit design, and may be close to the theoretical 1.22 eV bandgap of silicon at 0 K. The bandgap voltage may have a precision of ±0.5% across a temperature range of −40 C to 125 C, for example.

An output of op amp 122 controls transistor M2 to produce a bandgap current 124 through resistor divider network R10-R15 to produce a bandgap reference voltage (VBG) 126 that may be distributed to various regulators and/or phase locked loops, for example. Op amp 122 compares VBG 126 to VBG-int 118 such that VBG 126 is controlled to be approximately equal to VBG-int 118. In this example, low drop out (LDO) regulator 1340 uses VBG 126 as a voltage reference to produce a regulated voltage VDDC for use by core logic within an integrated circuit, for example. Source voltage VDD is provided to PMM 100 from an external source, such as a battery, for example.

In this example, low drop out (LDO) regulator 130 uses a second bandgap reference voltage (Vref2) 127 produced by divider network R10-R15 as a voltage reference to produce a regulated voltage VDDF of approximately 1.6 v for use by a ferroelectric memory device, for example. Capacitor 132 provides failsafe energy storage, as will be described in more detail below.

Failure detection logic 136 includes a fast comparison circuitry to determine when VDD drops below a threshold value, as described in more detail in U.S. Pat. No. 8,390,333, entitled "Adaptively Biased Comparator," and/or in U.S. Pat. No. 8,400,849, entitled "Electronic Device for Monitoring a Supply Voltage," both of which are incorporated by reference herein. Failure detection circuitry 136 monitors a third bandgap reference voltage (Vref3) produced by divider network R10-R15 as a voltage reference to determine when VDD drops below a threshold value. In this example, PMM 100 includes two comparators 137, 138 that are configured to detect when device supply voltage VDD drops below a threshold value as indicated by high-side supervisor signal SVSH and to detect when the core voltage VDDC drops below a threshold value as indicated by low side supervisor signal SVSL.

Figure 2:
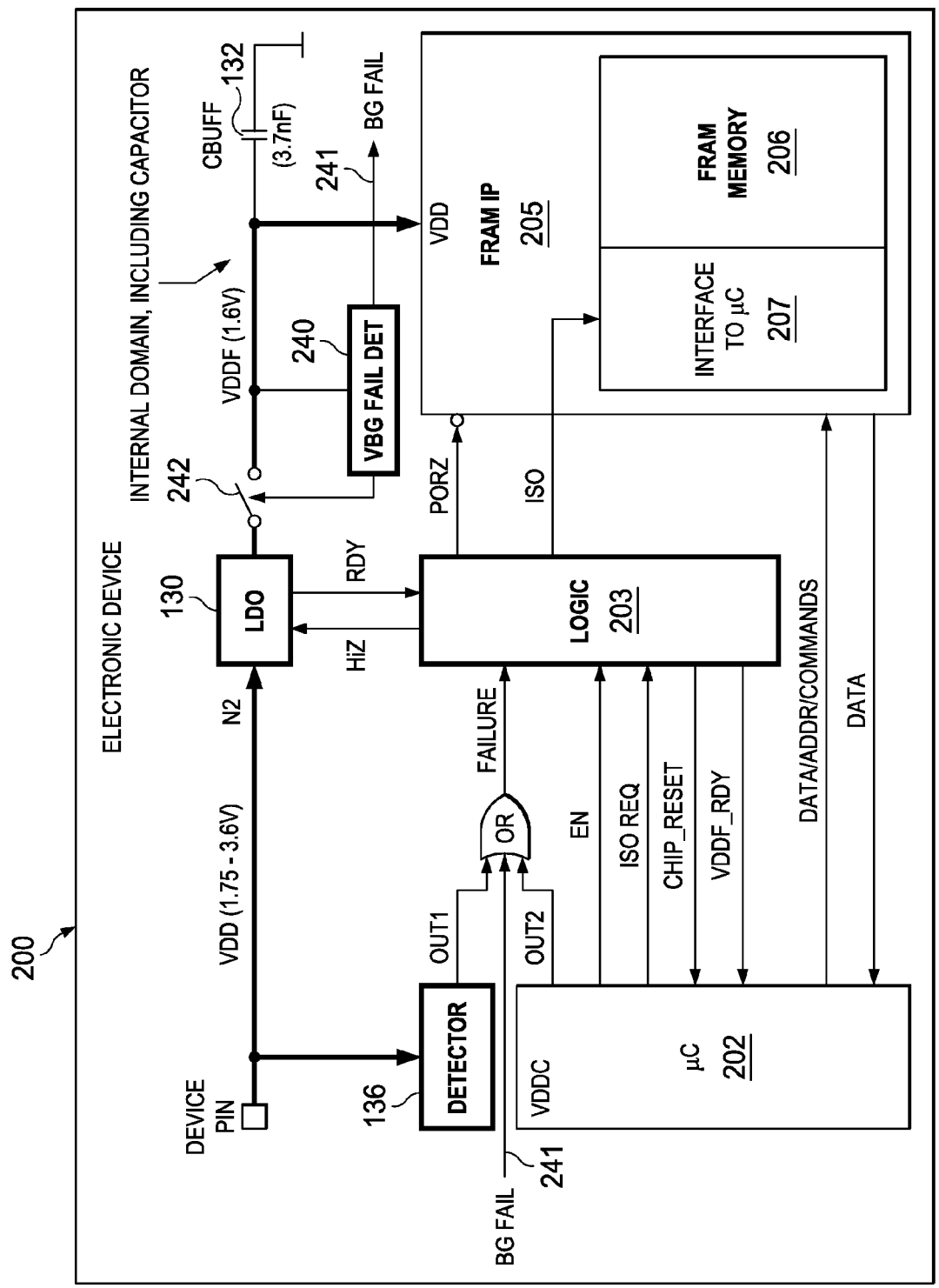
FIG. 2 is a block diagram of an example SoC that utilizes a failure detection circuit to detect a failure in the bandgap reference of FIG. 1.

FIG. 2 is a simplified circuit block diagram of a system on chip (SoC) 200. SoC 200 includes microprocessor 202, also referred to as a microcontroller (μC), that is configured to execute software instructions stored in memory within SoC 200. Ferroelectric random access memory (FRAM) subsystem 205 includes FRAM storage 206 and interface circuitry 207 that is coupled to allow microcontroller 202 to access instructions and data that are stored in FRAM 206. Microcontroller 202 may be any of several known or later developed microcontrollers, such as: reduced instruction set computer (RISC), a microprocessor, an application specific integrated circuit (ASIC), field programmable gate array (FPGA), digital signal processor (DSP), etc., for example. μC 202 may include embedded cache memory, for example. There may also be a block of conventional static random access memory (SRAM) provided within SoC 200 for temporary data and/or instruction storage, for example.

SoC 200 may also include various types of peripheral devices, counters, communication interfaces, sensors, signal receivers and drivers, etc., for example. SoC 200 may include multiple microcontrollers and/or multiple blocks of FRAM, SRAM and/or other types of known or later developed memory storage modules, for example.

Ferroelectric random access memory is a non-volatile memory technology with similar behavior to DRAM (dynamic RAM). Each individual bit can be accessed and unlike EEPROM (electrically erasable programmable read only memory) or Flash, FRAM does not require a special sequence to write data nor does it require a charge pump to achieve the higher programming voltages. FRAM typically programs at 1.5V versus the 10-14V of Flash or EEPROM. While Flash programming occurs through a tunneling mechanism, FRAM programming relies on a ferroelectric effect to induce polarization in a dipolar molecule. The ferroelectric effect occurs due to the electrical dipole formed by Zirconium (Zr) and Oxygen (O) atoms in a ceramic Lead-Zirkonate-Titanate crystal (PZT) of the FRAM cell. The electric field causes a polarization hysteresis effect as it moves the Zi-atom within the PZT crystal with increasing field strength. The hysteresis occurs as a result of the interaction of this Zi-atom with the O-atoms. The Zi-atom is moved from one direction or the other by the polarity of the electric field. Unlike a magnetic hysteresis effect, the polarization hysteresis of the PZT molecule is not influenced by external magnetic fields. The Zi-atom atom will remain in place unless an electric field is applied and provides for non-volatility of the memory when power has been removed. This means that it wears down far less if at all for each memory operation, and consequently lasts over 1 billion times longer than Flash. Also, since FRAM is not written through a tunneling mechanism, it is up to 1000× more resistant to radiation such as gamma rays than Flash/EEPROM.

Writing is accomplished by applying a field across the ferroelectric layer by charging the plates on either side of it, forcing the atoms inside into the "up" or "down" orientation (depending on the polarity of the charge), thereby storing a "1" or "0". Reading, however, is somewhat more involved. The transistor forces the cell into a particular state, say "0". If the cell already held a "0", nothing will happen in the output lines. If the cell held a "1", the re-orientation of the atoms in the film will cause a brief pulse of current in the output as they push electrons out of the metal on the "down" side. The presence of this pulse means the cell held a "1". Since this process overwrites the cell, reading FRAM is a destructive process, and requires the cell to be re-written if it was changed. This operation is referred to herein as "write back."

FRAM does not need a pre-erase cycle and the molecule polarizes in 1 or 2 nanoseconds, the write operation is about 1000× faster than the previously mentioned nonvolatile counterparts. Because the speed of FRAM is equivalent to embedded Static RAM in many microcontrollers in addition to its dynamic accessibility and non-volatility, it is what is commonly referred to as a Universal Memory. This means it can function as the data memory or the program memory at any given time in its life. This gives designers the freedom to create embedded software that may rely heavily on data processing, depending on their specific needs, without worrying about the limitations of the microcontroller. No other embedded memory can claim this feature.

In this example, FRAM 206 provides 16 kB of storage and μC 202 is a 16-Bit RISC architecture that operates at speeds up to 8-MHz. However, other embodiments may include other types of processor and different memory capacities. Since the FRAM is non-volatile, an application program may be stored within FRAM 206 for execution by μC 202. A portion of FRAM 206 may also be allocated for use as a data memory to store data that is collected from various sensors (not shown). Since FRAM does not have the write restrictions associated with Flash non-volatile memory, FRAM 206 may be used as a scratch pad memory during processing of the collected sensor data, for example.

LDO 130 provides a regulated VDDF for FRAM subsystem 205, as described above. A second LDO 134 may provide a different VDDC for μC 202 and other logic within SoC 200, for example. A single bandgap reference circuit 110 may be used for both LDO's, or there may be a separate bandgap reference circuit for each LDO, for example. The supply voltage level VDDF (secondary supply voltage level) is approximately 1.6 volts in this embodiment. The secondary supply voltage level VDDF of the VDDF supply voltage domain is buffered by a capacitor CBUFF 132. The voltage regulator LDO 130 may issue a signal RDY which signals that the LDO is ready to supply a regulated VDDF after it has been enabled.

Various detection circuits may be included in SoC 200 to determine when various voltage levels drop below a threshold value. For example, in some embodiments detection circuitry 136, referring back to FIG. 1, may be provided to determine when VDD drops below a threshold value. In some embodiments, slow comparators 137, 138, referring back to FIG. 1, may assert an SVSH or SVSL signal if the input voltage VDD or core voltage VDDC fall below a selected threshold value, as described with regard to FIG. 1. In some embodiments, there may be an additional set of comparators that monitor VDDF and assert an SVSL signal in the case that VDDF drops below a selected threshold, for example Detector 136 is coupled to the primary supply voltage level VDD, which is also coupled to node N2. The first supply voltage level VDD may have a voltage range from 1.75 V to 3.6 V in this embodiment. When a low voltage condition is detected by detection circuit 136, a signal OUT1 is asserted that in turn asserts a FAILURE signal to logic circuit 203. Logic circuit 203 in turn generates a reset signal PORZ that is provided to FRAM subsystem 205. The control circuitry of the FRAM 205 may be initialized by signal PORZ. Isolation signal ISO is configured to switch the interface of the FRAM memory 206 into high ohmic state.

Whenever logic 203 receives the failure signal FAILURE from either the μC 202 or detector 136 through the OR gate, logic 203 can switch the voltage regulator LDO 130 into a high ohmic state through signal HiZ. Accordingly, in response to a failure of the supply voltage level VDD, the output of the voltage regulator LDO 130 may be switched immediately into a high ohmic state. This isolates the VDDF supply voltage domain and the FRAM 205 may then be powered by the charge stored on buffer capacitor CBUFF for a short period of time. The amount of charge (or energy) is sufficient for finishing a complete write-back cycle. The signals issued by logic 203 may then be the power-on reset signal PORZ and the isolation signal ISO for isolating and switching down the FRAM. The signal PORZ is asserted after a delay which is sufficiently long to let the FRAM complete an ongoing access cycle.

The FRAM 205 supply voltage VDDF is buffered with an integrated capacitor CBUFF 132, which has a value of 3.7 nF in this embodiment, for example. The capacitor CBUFF holds a charge reserve at all times to complete an ongoing memory access, including write-back, even when the LDO 130 voltage regulator is cut off. Detector 136 constantly monitors the overall chip supply for VDD at node N2. The FRAM 205 is designed to perform self-timed memory access without interaction with the microcontroller μC 202.

If the input voltage VDD fails, the interface 207 of the FRAM 205 to the μC 202 is isolated, suppressing further memory access requests. Additionally, the LDO 130 is disconnected from the internal supply (second voltage domain VDDF), leaving the buffer capacitor CBUFF as the only source for completing an ongoing memory access. At the same time, the microcontroller μC 202 can be reset.

It has now been discovered that for some VDD failure modes, the slow SVSH and SVSL comparators and the fast failure detector 136 may not be sufficient to detect a failure in time to allow FRAM 206 to complete a memory writeback cycle. A quick drop in VDD is typically detected correctly by detector 136. Similarly, a slow drop in VDD is typically detected correctly by detector 136. However, for some cases of a medium rate drop in VDD, bandgap reference circuit 110 may fail before detector 136 detects a VDD failure. In this case, the charge on capacitor CBUFF may be drained prior to completion of a write-back to FRAM 205 which may then cause a failure within FRAM memory 206 that results in loss of data stored in FRAM 205. Another failure that may be missed by detector 136 may be the result of an electrical discharge event (ESD) that changes voltages on various internal nodes and that may corrupt the bandgap reference circuit, for example.

In order to detect a failure of the bandgap reference circuit early enough to allow FRAM 205 to correctly cease operating before the charge on buffer capacitor CBUFF is dissipated, a bandgap reference failure detection circuit 240 as included within SoC 200. When BG detection circuit 240 detects a bandgap circuit failure, it asserts BF fail signal 241 that is provided to logic 203 to initiate a reset operation, as described above. In some embodiments, there may be a pass gate 242 that may be used to isolate buffer capacitor and the VDDF voltage domain from any path to the device supply rail, including NWELL bulk diodes. In other embodiments, the high z mechanism within LDO 130 that is controlled by the HIZ signal from logic 203 is sufficient.

A failure of the bandgap reference circuit may be detected by comparing a present value of the bandgap reference voltage 126 to a prior value or to a model value. The prior value may be obtained by periodically sampling and storing a representation of VBG 126, for example. Alternatively, an RC circuit may be used to create a delayed version of the VBG voltage, for example. These and other techniques will now be described in more detail.

Figure 3:
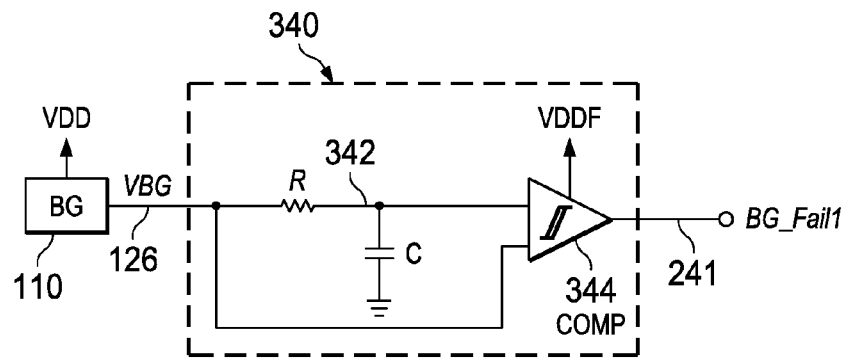
FIGS. 3-6 are circuit diagrams of various embodiments of failure detection circuits that may be used in the SoC of FIG. 2.

FIG. 3 is a schematic of a BG failure detection circuit 340 that uses a simple RC filter circuit to capture a delayed representation of VBG 126 on node 342. The values of R and C are chosen so that during steady state operation the voltage on node 342 will be approximately equal to VBG 126, which is typically approximately 1.2 v; which will be referred to herein as a "model" value. When VBG falls, the model voltage on 342 will be retained for a period of time according to the RC time constant. Comparator 344 then compares VBG 126 to the model voltage on node 342 and asserts BG_fail signal 241 whenever VBG<1.2 v−Voffset, where Voffset is the offset voltage of comparator 344, and the steady state value of VBG is approximately 1.2 v. The offset voltage of the comparator may be designed to provide an appropriate margin of error in detecting a failure. If the offset is too small, false failures may be detected.

Failure detection circuit 340 is accurate, but requires some extra current and area for comparator 344.

Figure 4:
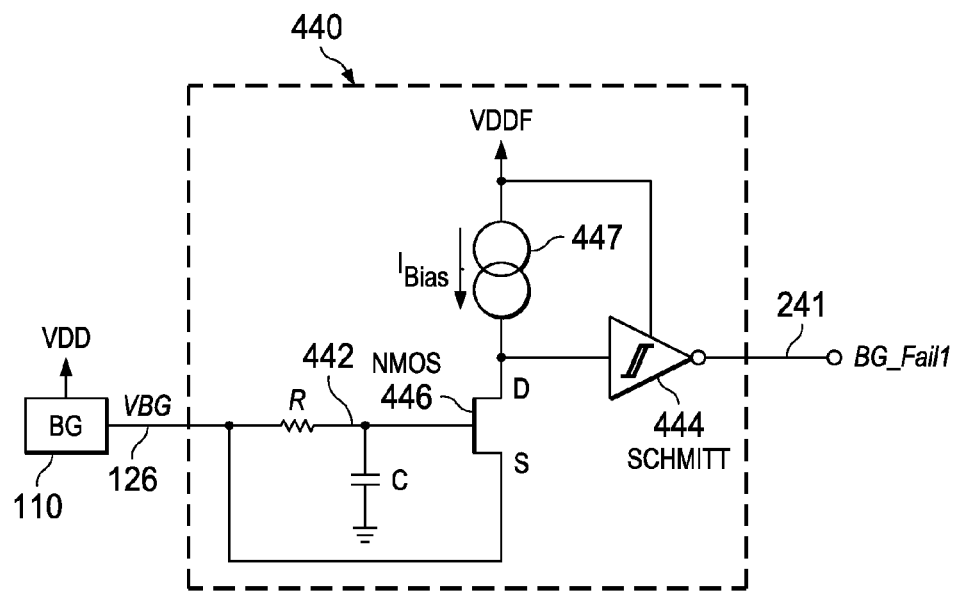

FIG. 4 is a schematic of a BG failure detection circuit 440 that uses a simple RC filter circuit to capture a delayed representation of VBG 126 on model voltage node 442, in a similar manner to circuit 340. In this example, node 442 is coupled to the gate of NMOS transistor 446. The source node of NMOS 446 is coupled to the present value of VBG. Current source 447 is coupled to the drain node of NMOS 446 and provides a bias current through NMOS transistor 446. While VGB 126 is approximately 1.2V, NMOS 446 is off and keeps the Schmitt-trigger 444 input level high and the output is low. If the VBG 126 drops, the current through NMOS 446 rises and the Schmitt-trigger input level decreases until the Schmitt-trigger reacts. In the end, NMOS Vth and the Schmitt-trigger level from a comparator function to determine when BG_fail 241 is asserted. Schmitt trigger 444 asserts BG_fail signal 241 approximately whenever VBG<1.2 v–VthN, where VthN is the threshold voltage of transistor 446.

Failure detection circuit 440 is simple and requires little extra current or area for Schmitt trigger 444. However, process variation may affect VthN and therefore accuracy may be less than that for circuit 340.

Figure 5:
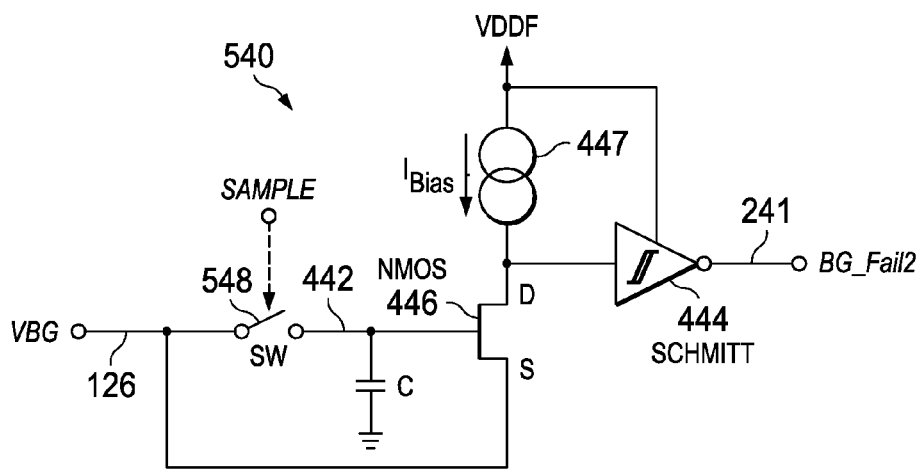

FIG. 5 is a schematic of a BG failure detection circuit 540 that uses a simple switch circuit 548 to capture a sampled representation of VBG 126 on model voltage node 442. Otherwise, detection circuit 540 operates in a similar manner to circuit 440. Switch 548 is operated in a periodic manner to allow a representation of VBG 126 to be stored on capacitor C, while holding the stored model value for a long enough period of time to detect when VBG 126 is failing.

Failure detection circuit 540 is simple and requires little extra current or area for Schmitt trigger 444. However, process variation may affect VthN and therefore accuracy may be less than that for circuit 340. Sampling allows capacitor C to be smaller than the capacitor of circuit 440.

Figure 6:
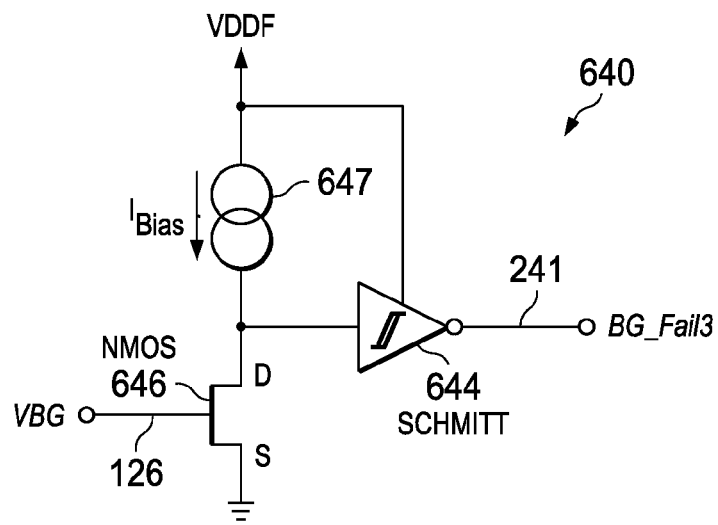

FIG. 6 is a schematic of a BG failure detection circuit 640 in which VBG is coupled to the gate of NMOS 646. Circuit 640 operates in a similar manner to circuit 440, except that the threshold voltage of NMOS 646 and the trigger level of Schmidt trigger 644 are designed so that during correct steady state operation, the bias current provided by current source 647 produces a low voltage on the input to Schmidt trigger 644. When VBG 126 begins to fail, the voltage on the input to Schmidt trigger increases and BG_fail signal 241 is asserted. The Vth of NMOS 646 and the Schmitt-trigger level determine when BG_fail 241 is asserted. Schmitt trigger 644 asserts BG_fail signal 241 approximately whenever VBG<VthN, where VthN is the threshold voltage of transistor 646. In this example, the Vth of NMOS 646 acts as a model voltage.

While several embodiments of a BG failure detection circuit have been discussed, many other circuit topologies may be used. For example, a sampling circuit may be used with a comparator, such as in FIG. 3, etc.

In all of the examples described above, the BG failure detection circuit may be included in the VDDF power domain. The VDDF power domain is somewhat "failsafe" due to the buffer capacitor CBUFF and the ability to disconnect the VDDF voltage domain from the rest of the SoC circuitry. This allows the BG failure detection circuitry to operate reliably in the face of failing primary power VDD.

Figure 7:
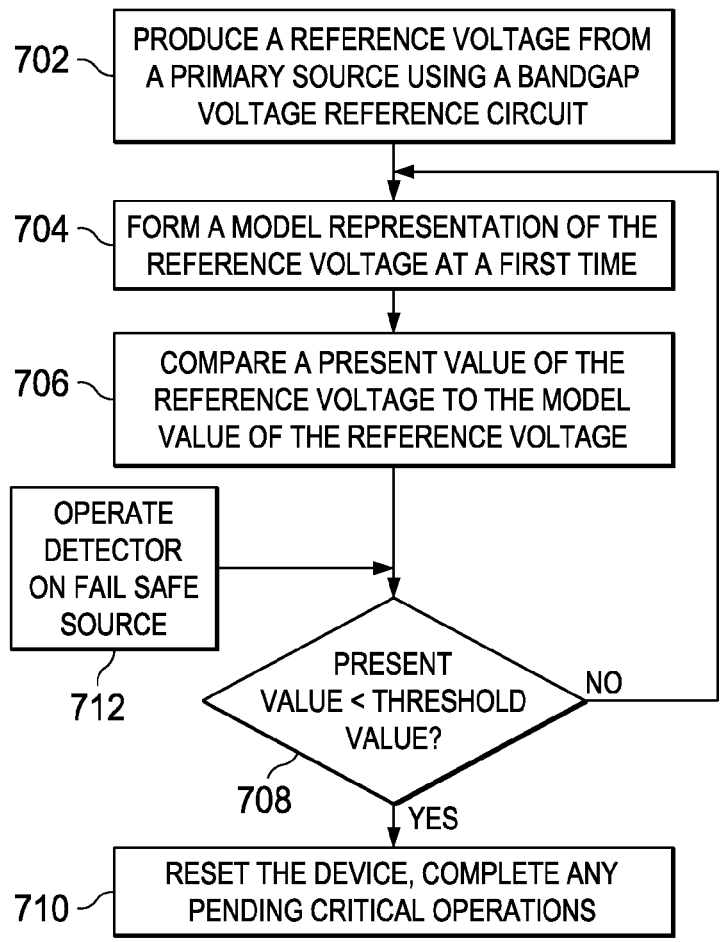
FIG. 7 is a flow diagram illustrating operation of a bandgap reference failure detection circuit.

FIG. 7 is a flow diagram illustrating operation of a bandgap reference failure detection circuit, such as any of the circuits illustrated in FIGS. 3-6. As discussed above, a reference voltage is produced 702 from a source of primary power using a bandgap voltage reference circuit within a device, such as a system on chip device containing processor and memory circuitry.

A model value of the band gap reference voltage is formed 704 that provides a representation of the band gap reference voltage at an earlier time.

A present time representation of the reference voltage is compared 706 to the model value.

The device is reset 710 when the present value is less than the model value by a threshold value. In some embodiments, the threshold value is determined by an offset value of a comparator, such as comparator 344, for example. In another embodiment, the threshold value is determined by a trigger value for a Schmidt trigger, such as Schmidt trigger 444, for example.

In some embodiments, the representation of the reference voltage at an earlier time is formed by sampling the reference voltage in a periodic manner and holding the sample value as the model value. The model value may be held on a capacitor, such as capacitor C of FIG. 5, for example.

In another embodiment, the model value of the reference voltage at an earlier time is formed by time delaying the reference voltage. This may be done using a simple RC filter, such as illustrated in FIGS. 3 and 4, for example.

In another embodiment, the model value of the reference voltage at an earlier time may be formed by a threshold voltage of a transistor, such as NMOS 646, for example. In this case, the threshold voltage of NMOS 646 in combination with a sense circuit such as Schmidt trigger 644 is designed to represent a nominal reference voltage level of 1.2 v, for example.

As discussed in more detail above, the circuitry that performs the comparing and resetting may be powered 712 from a failsafe source. This allows critical circuitry, such as FRAM 205, to complete 710 an operation such as a write back after a reference voltage failure is detected while the device is being reset.

Typically, each reset source such as: BOR (brown out reset), BG (bandgap), SVSH, VDDfail, Vcore_overload, etc., for example, triggers a reset. However, in some embodiments different failure detection resources may be handled in different manners. In this example, when any failure is detected a reset is performed by logic 203. The system then restarts from the beginning. During a reset, a BOR circuit is looking for a specific primary voltage level. When the primary voltage level is high enough the bandgap circuit is started. The BG module includes several mechanisms to make sure that the VBG is correctly at 1.2V. Some of these mechanisms are switched off after the BG is released to save current. A BG_ok signal starts the band gap reference output and a reference_ok signal starts the power supervisor circuits (SVS). After the SVS releases, the LDO's are started. On chip modules such as processor(s), memory, peripheral(s), etc., for example, then commence operation.

Other Embodiments

While the invention has been described with reference to illustrative embodiments, this description is not intended to be construed in a limiting sense. Various other embodiments of the invention will be apparent to persons skilled in the art upon reference to this description. For example, multiple bandgap reference circuits along with bandgap failure detection circuits may be deployed on a single integrated circuit as described herein.

While the bandgap failure detection circuit described herein is powered by the failsafe VDDF domain, in other embodiments the bandgap failure detection circuit may be powered by other than a failsafe domain.

While an FRAM storage module was described herein as a critical resource, other embodiments may include other types of critical circuitry that must be allowed to complete an operation before sufficient operating voltage is lost, such as other types of known or later developed non-volatile memory cells, for example.

Embodiments of a bandgap reference with failure detection circuitry and methods described herein may be used in all manner of applications, e.g.: various monitoring and process control systems in manufacturing, transportation, and business applications; electronic thermostats and heating and air conditioning control systems; thermometers; fixed and mobile computing system, personal digital assistants such as tablets, pads or smart phones; etc, for example.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for operating a device, the method comprising:
   producing a reference voltage from a source of primary power using a bandgap voltage reference circuit within the device;
   forming a model value of the reference voltage from a first time;
   comparing a present value of the reference voltage at a second time to the model value; and
   resetting the device when the present value is less than the model value by a threshold value;
   powering a detection circuit that compares the model value to the present value with a failsafe source of power, wherein the failsafe source of power is configured to provide an adequate operating voltage for the detection circuit and other critical circuitry for a period of time that is greater than the time difference between the first time and the second time; and
   completing a pending operation by the critical circuitry during the period of time by using the failsafe source of power.

2. The method of claim 1, wherein resetting the device comprises disconnecting the failsafe source of power from non-critical circuitry.

3. The method of claim 1, wherein the critical circuitry is a ferroelectric random access memory (FRAM), further comprising completing a write-back operation in the FRAM while resetting the device.

4. An integrated circuit comprising:
   a bandgap voltage reference circuit with a reference voltage output; and
   a bandgap failure detection circuit coupled to the reference voltage output, wherein the bandgap failure detection is configured to:
   form a model value of the reference voltage from a first time;
   compare a present value of the reference voltage at a second time to the model value; and
   assert a fail signal to indicate when the present value is less than the model value by a threshold value;
   wherein the bandgap failure detection circuit comprises:
   sample and hold circuitry coupled to the bandgap reference voltage output to form the model value; and
   a comparator coupled to receive the model value and the bandgap reference voltage with an output to indicate when the present value is less than the model value by a threshold value;
   wherein the comparator comprises:
   a current source coupled to a drain of an NMOS transistor;
   a gate of the NMOS transistor coupled to the model value;
   a source of the NMOS transistor coupled to the bandgap reference voltage output; and
   an input of a Schmidt trigger coupled to the drain of the NMOS transistor, an output of the Schmidt trigger being the output to indicate when the present value is less than the model value by a threshold value.

5. An integrated circuit comprising:
   a bandgap voltage reference circuit with a reference voltage output; and
   a bandgap failure detection circuit coupled to the reference voltage output, wherein the bandgap failure detection is configured to:
   form a model value of the reference voltage from a first time;
   compare a present value of the reference voltage at a second time to the model value; and
   assert a fail signal to indicate when the present value is less than the model value by a threshold value;
   wherein the bandgap failure detection circuit comprises:
   a delay filter coupled to the bandgap reference voltage output to form the model value; and
   a comparator coupled to receive the model value and the bandgap reference voltage with an output to indicate when the present value is less than the model value by a threshold value;
   wherein the comparator comprises:
   a current source coupled to a drain of an NMOS transistor;
   a gate of the NMOS transistor coupled to the model value;
   a source of the NMOS transistor coupled to the bandgap reference voltage output; and
   an input of a Schmidt trigger coupled to the drain of the NMOS transistor, an output of the Schmidt trigger being the output to indicate when the present value is less than the model value by a threshold value.

6. An integrated circuit comprising:
   a bandgap voltage reference circuit with a reference voltage output; and
   a bandgap failure detection circuit coupled to the reference voltage output, wherein the bandgap failure detection is configured to:

form a model value of the reference voltage from a first time;
compare a present value of the reference voltage at a second time to the model value; and
assert a fail signal to indicate when the present value is less than the model value by a threshold value;
wherein the bandgap failure detection circuitry comprises:
a current source coupled to a drain of an NMOS transistor;
a gate of the NMOS transistor coupled to the bandgap reference voltage output;
a source of the NMOS transistor coupled to a ground reference; and
an input of a Schmidt trigger coupled to the drain of the NMOS transistor, an output of the Schmidt trigger being the output to indicate when the present value is less than the model value by a threshold value.

7. An integrated circuit comprising:
a bandgap voltage reference circuit with a reference voltage output; and
a bandgap failure detection circuit coupled to the reference voltage output, wherein the bandgap failure detection is configured to:
form a model value of the reference voltage from a first time;
compare a present value of the reference voltage at a second time to the model value; and
assert a fail signal to indicate when the present value is less than the model value by a threshold value;
a regulator coupled to the bandgap reference voltage output, the regulator configured to produce a regulated output voltage in response to the bandgap reference voltage; and
a failsafe voltage domain coupled to receive the regulated output voltage via a switch circuit, such that the failsafe voltage domain is isolated from the regulator in response to the fail signal being asserted.

8. The integrated circuit of claim 7, further comprising a critical circuit coupled to the failsafe voltage domain, wherein the failsafe voltage domain comprises sufficient energy storage to provide an adequate operating voltage for the detection circuit and the critical circuitry for a period of time to complete a pending operation by the critical circuitry after the fail signal is asserted.

9. The integrated circuit of claim 8, wherein the critical circuitry is a ferroelectric random access memory (FRAM) and the pending operation is a write-back operation in the FRAM.

* * * * *